(12) United States Patent
Bae

(10) Patent No.: US 9,343,364 B2
(45) Date of Patent: May 17, 2016

(54) SEMICONDUCTOR DEVICE AND METHOD FOR MANUFACTURING THE SAME

(71) Applicant: SK hynix Inc., Icheon (KR)

(72) Inventor: Byung Wook Bae, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/611,128

(22) Filed: Jan. 30, 2015

(65) Prior Publication Data

US 2015/0147878 A1    May 28, 2015

Related U.S. Application Data

(62) Division of application No. 13/718,968, filed on Dec. 18, 2012, now abandoned.

(30) Foreign Application Priority Data

Aug. 16, 2012 (KR) .......................... 10-2012-0089571

(51) Int. Cl.
*H01L 21/768* (2006.01)
*H01L 23/538* (2006.01)
*H01L 21/48* (2006.01)
*H01L 23/14* (2006.01)
*H01L 23/498* (2006.01)
*H01L 21/308* (2006.01)

(52) U.S. Cl.
CPC ........ *H01L 21/76898* (2013.01); *H01L 21/308* (2013.01); *H01L 21/486* (2013.01); *H01L 21/7684* (2013.01); *H01L 21/76831* (2013.01); *H01L 21/76877* (2013.01); *H01L 23/147* (2013.01); *H01L 23/49827* (2013.01); *H01L 23/5384* (2013.01); *H01L 2924/0002* (2013.01)

(58) Field of Classification Search
CPC ............ H01L 21/768; H01L 21/76801; H01L 21/76804; H01L 21/76831; H01L 21/76898
See application file for complete search history.

(56) References Cited

U.S. PATENT DOCUMENTS

| 2012/0028412 | A1  | 2/2012  | Jeong et al. |
| 2012/0270391 | A1* | 10/2012 | Zengxiang .......... H01L 21/3212 438/653 |
| 2013/0119543 | A1* | 5/2013  | Yu ..................... H01L 21/76898 257/741 |

FOREIGN PATENT DOCUMENTS

| KR | 10-2009-0114492 A | 11/2009 |
| KR | 10-2012-0012602 A | 2/2012 |

* cited by examiner

Primary Examiner — Eduardo A Rodela

(57) ABSTRACT

A semiconductor device includes a semiconductor substrate having two surfaces. First side faces second side and includes recesses, and a plurality of through silicon vias (TSV), which penetrate through the semiconductor substrate, are exposed by the recesses. Even when the TSVs have different heights from each other or the degree of back-grinding is changed, due to a process parameters, yield of the semiconductor device is improved by reducing failure caused when a TSV is not exposed.

8 Claims, 6 Drawing Sheets

SEMICONDUCTOR DEVICE AND METHOD FOR MANUFACTURING THE SAME

CROSS-REFERENCES TO RELATED APPLICATION

The present application is a divisional of U.S. patent application No. 13/718,968, filed on Dec. 18, 2012, which claims priority to Korean patent application number 10-2012-0089571, filed on 16 Aug. 2012, which is incorporated by reference in its entirety.

BACKGROUND OF THE INVENTION

1. Technical Field

The present invention relates to a semiconductor device and a method for manufacturing the same.

2. Related Art

Stacking technology to form a three-dimensional (3D) semiconductor integrated circuit (IC) has been developed to reduce the size of electronic appliances, increase stack density, and improve performance. The 3D stack package is a package in which a plurality of chips each having the same storage capacity are stacked, and is generally referred to as a stack chip package.

A stack chip package reduces fabrication costs using a simplified manufacturing process and enables mass production. However, a highly integrated stack chip package also has reduced interconnection space for electrical connections between chips.

In a conventional stack chip package, bonding pads of chips are electrically connected by bond wires to package pads disposed laterally with respect to the bonding pads of the chips. Therefore, space for accommodating the bond wires is necessary, and thus a unit package size is increased.

To resolve this issue, a stack chip package using a through-siliconvia (TSV) has been suggested. In a TSV stack chip package, TSVs are formed through chips, and electrical connections between the stacked chips are made by vertically connecting the TSVs. A chip stacking method using TSVs according to the related art will be described in brief below.

FIGS. 1A to 1B are cross-sectional views illustrating a method of forming a semiconductor device according to the related art.

Referring to FIG. 1A, holes (not shown) are formed in a wafer 10, and the holes are filled with a conductive metal to form TSVs 12 (The first TSV and the second TSV). At this time, the TSVs 12 (The first TSV and the second TSV) may have variations in depths due to various process variables.

Referring to FIG. 1B, a rear surface of the wafer 10 is subject to a back-grinding process to expose the TSVs 12. Some TSVs (The first TSVs) 12 having relatively shallow depths may not be exposed by the back grinding process, as indicated by "A" of FIG. 1B.

In order to solve this problem, the TSVs can be formed more deeply while maintaining the thickness by which a part the wafer is removed in the back-grinding process. However, in that case, the heights of the TSVs protruding out of the back surface of the wafer increases, causing device failures. On the other hand, if the rear surface of the wafer is excessively etched to expose the shallower TSVs, the wafer becomes thin and thus becomes vulnerable to cracks.

SUMMARY

One or more exemplary embodiments are directed to improving yield of a semiconductor device when the bottom of a TSV is not exposed due to a process parameter, and reducing vulnerability to the occurrence of cracks due to a reduction in the thickness of a wafer.

According to one aspect of an exemplary embodiment, there is provided a semiconductor device. The semiconductor device may include: a semiconductor substrate having a first side and a second side opposite to the first side; recesses provided in the second side; and the first through silicon vias (TSV) exposed by the recesses and penetrating the semiconductor substrate.

The semiconductor device may further include a mask pattern provided over the first side of the semiconductor substrate, wherein an upper surface of the mask pattern is level with an upper surface of the first TSV, and a metal interconnection provided over the mask pattern and coupled to the first TSV.

The first TSV and the second TSV are formed to have different depths from each other from the first side.

The first TSV and the second TSV may be have a depth smaller than a thickness of the semiconductor substrate.

The semiconductor device may further include an insulating layer formed between the first TSV and the semiconductor substrate and between the second TSV and the semiconductor substrate.

The insulating layer may include an oxide layer.

The first TSV and the second TSV may include copper and a barrier metal layer.

According to another aspect of an exemplary embodiment, there is provided a method for manufacturing a semiconductor device. The method may include: forming a first insulating layer over a bottom of a contact hole formed in a semiconductor substrate including a first side and a second side opposite to the first side; forming a through silicon via (TSV) over the first insulating layer to fill the contact hole; back-grinding the second side of the semiconductor substrate to expose the first insulating layer; and removing the first insulating layer to form a recess in the second side of the semiconductor substrate.

The forming a first insulating layer on a bottom of a contact hole may include forming a mask pattern on the semiconductor substrate, etching the semiconductor substrate using the mask pattern as an etch mask to form the contact hole, and forming the first insulating layer over the semiconductor substrate including the contact hole.

The first insulating layer may be formed of an oxide layer or a nitride layer.

The method may further a second insulating layer over the first insulating layer, the mask pattern, and the first side of the semiconductor substrate, after the forming the first insulating layer.

The second insulating layer may be formed of an oxide layer.

The forming a TSV may include forming a metal material over the first insulating layer and the mask pattern to fill the contact hole, and performing a planarization process on the metal material to expose the mask pattern.

The metal material may include copper.

The method may further include, after forming a TSV, forming a metal interconnection coupled to the TSV, the metal interconnection being provided over the mask pattern, and forming a passivation layer over the metal interconnection.

The back-grinding the semiconductor substrate to expose a bottom of the first insulating layer may include back-grinding the second side of the semiconductor substrate to expose the first insulating layer.

The removing the first insulating layer may include performing a dip-out process.

The first insulating layer may be provided over the bottom surface of the contact hole, but is not provided over sidewalls of the contact hole.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1A:
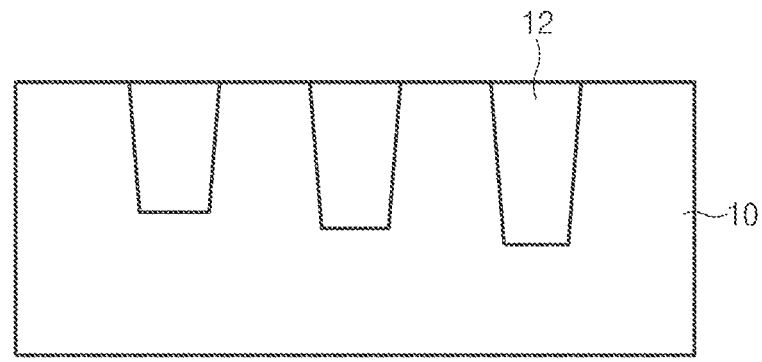
FIGS. 1A and 1B are cross-sectional views illustrating a method for manufacturing a semiconductor device according to the related art.
Figure 1B:
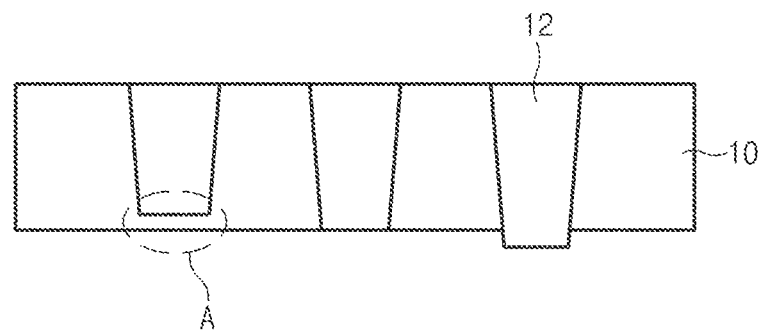

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 2:
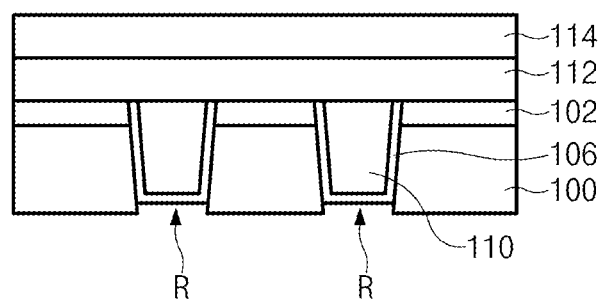
FIG. 2 is a cross-sectional view illustrating a semiconductor device according to an exemplary embodiment of the present invention.

FIG. 2 is a cross-sectional view illustrating a semiconductor device according to an exemplary embodiment of the present invention.

As shown in FIG. 2, a semiconductor device according to an exemplary embodiment includes a semiconductor substrate 100 having first and second sides. The second side faces the first side and includes recesses. A plurality of a through silicon vias (TSVs) (the first TSV and the second TSV) penetrate through the semiconductor substrate 100.

The semiconductor substrate 100 further includes a mask pattern 102 provided on the semiconductor substrate 100 and planarized so that an upper surface is level with an upper surface of the TSVs 110. A metal interconnection 112 is provided on the mask pattern 102 and is coupled to the TSVs (the first TSV and the second TSV) 110. A passivation layer 114 may be provided on the metal interconnection 112.

The semiconductor device may further include a second insulating layer 106 between each of the TSVs (the first TSV and the second TSV) 110 and the semiconductor substrate 100. In an embodiment, the second insulating layer 106 includes an oxide layer and serves to relieve stress applied to the TSVs 110. Further, the TSVs 110 may include copper and a barrier metal layer, which may be formed by using the copper as a seed.

The plurality of TSV 110 in the exemplary embodiment may have a height lower than a thickness of the semiconductor substrate 100 and may be formed to have different depths from each other from the first side. Even when the TSV (the first TSV and the second TSV) are formed to have different depths from each other, the problem that a bottom of the TSV 110 (the first TSV) is not exposed as in the related art does not occur by recesses R provided in the bottom of the TSV 110.

A semiconductor device having the above-described structure according to an embodiment of the present invention may be formed through the following method.

FIGS. 3A to 3H are cross-sectional views illustrating a method for manufacturing a semiconductor device according to an exemplary embodiment.

Figure 3A:
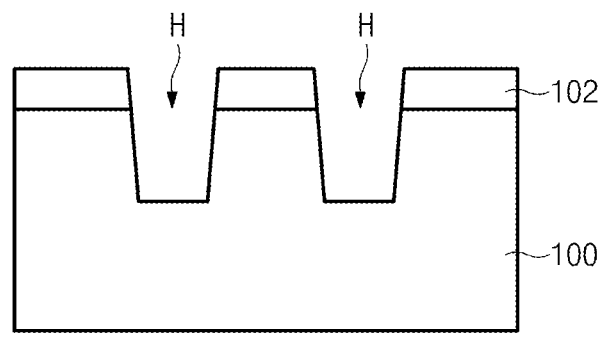
FIGS. 3A to 3H are cross-sectional views illustrating a method for manufacturing a semiconductor device according to an exemplary embodiment of the present invention.

Referring to FIG. 3A, a mask pattern 102 is formed on a wafer 100 and the wafer 100 is etched using the mask pattern 102 as an etch mask to form contact holes H. The contact holes H may be used to form TSVs in a subsequent process and depths of the contact holes may be changed according to a process margin and a process time. The contact hole according to the exemplary embodiment may be formed to have a depth much larger than that of a contact hole for a TSV in the related art.

Figure 3B:
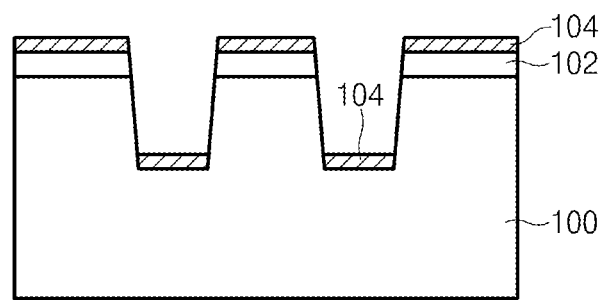

Referring to FIG. 3B, an insulating layer 104 is formed on the wafer 100 and the mask pattern 102. In an embodiment, the first insulating layer 104 may include an oxide layer or a nitride layer. Preferably, the first insulating layer 104 is not formed on the sidewalls of the contact holes H.

Figure 3C:
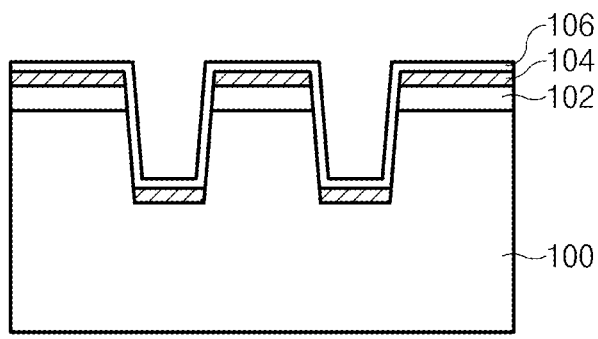

Referring to FIG. 3C, a second insulating layer 106 is formed on the first insulating layer 104 and the wafer 100. In an embodiment, the second insulating layer 106 is a curing insulating layer. The second insulating layer 106 may include an oxide layer and serves to relieve stress applied to a TSV which is formed in a subsequent process.

Figure 3D:
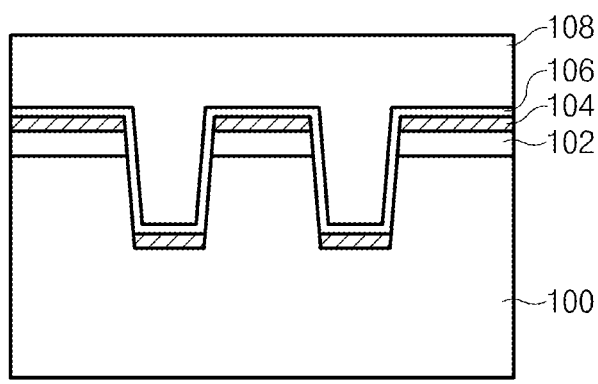

Referring to FIG. 3D, a metal material 108 is formed on the second insulating layer 106. The metal material 108 may include copper, and a barrier metal layer may be formed using the copper as a seed.

Figure 3E:
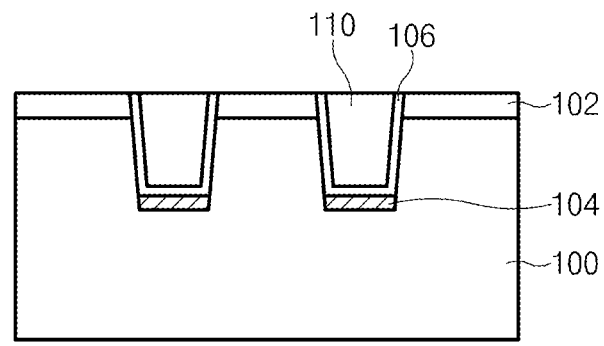
Figure 3F:
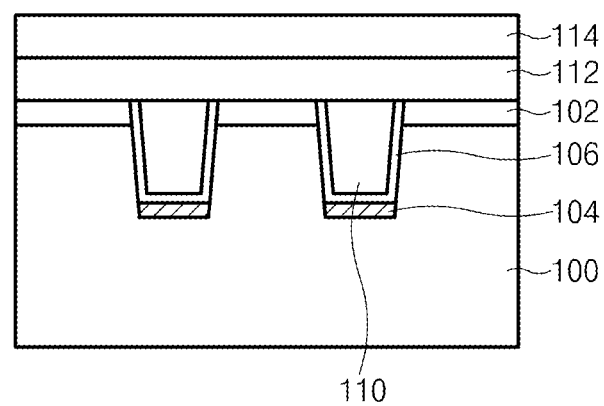
Figure 3G:
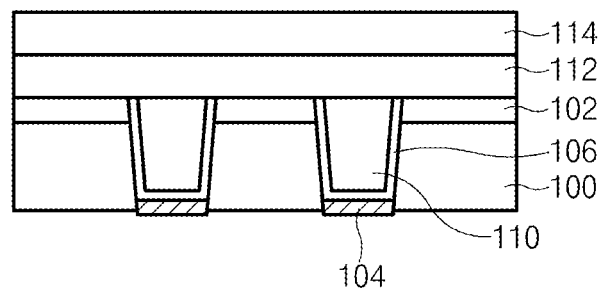

Referring to FIG. 3E, a planarization process is performed on the metal material 108 to expose the mask pattern 102, thus forming TSVs 110.

Referring to 3F, a metal interconnection 112 and a passivation layer 114 are formed on the mask pattern 102 and the TSVs 110.

Referring to 3G, a back grinding process is performed on the wafer 100 to expose the first insulating layer 104 below the TSV 110. The back grinding process is performed by considering a margin so that the first insulating layer is exposed. In an embodiment, the amount of the wafer (semiconductor substrate) removed by the back grinding process may be adjusted so that less is removed than in the related art. This is because the target of the back grinding process is set, not as the TSV 110, but as the insulating layer 104, which is formed below the TSV 110. Thus, the semiconductor substrate may be removed less, depending on the thickness of the first insulating layer 104, and problems that result from a thin semiconductor substrate, for example, a crack, can be prevented.

Figure 3H:
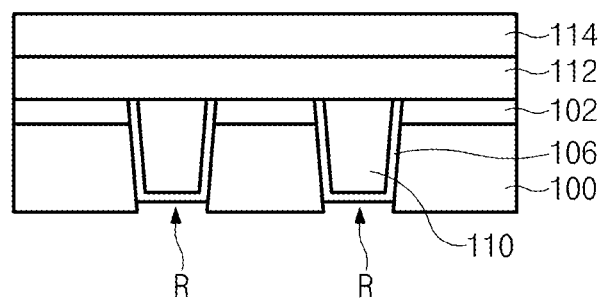

Referring to FIG. 3H, the first insulating layer 104 below the TSV 110 is removed to form a recess R in the back surface of the wafer 100. In an embodiment, the first insulating layer 104 may be removed through an etch process or a dip-out process. The second insulating layer 106, exposed when the first insulating layer 104 below the TSV 110 is removed, may be removed simultaneously or in a subsequent process. The process of etching the first insulating layer 104 may be performed using an etch selectivity difference between the insulating layer and the silicon. Therefore, the recess R is formed in the back surface of the wafer to expose the TSVs.

As described above, even when the depths of the TSVs are not uniform due to various process variables, the bottom of the TSVs can be securely exposed by a back grinding process and a process of removing the insulating layers. Thus, a production yield of the semiconductor device improves.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A method for manufacturing a semiconductor device, the method comprising:
    forming a mask pattern over the semiconductor substrate including a first side and a second side opposite to the first side;
    etching the semiconductor substrate using the mask pattern as an etch mask to form a contact hole;
    forming a first insulating layer over the semiconductor substrate including the contact hole;
    forming a second insulating layer over the first insulating layer, the mask pattern, and the first side of the semiconductor substrate;
    forming a through silicon via (TSV) over the second insulating layer to fill the contact hole;
    back-grinding the second side of the semiconductor substrate to expose the first insulating layer; and
    removing the first insulating layer to form a recess in the second side of the semiconductor substrate.

2. The method of claim 1, wherein the first insulating layer is formed of an oxide layer or a nitride layer.

3. The method of claim 1, wherein the second insulating layer is formed of an oxide layer.

4. The method of claim 1, wherein the forming of the TSV includes:
    forming a metal material over the first insulating layer and the mask pattern to fill the contact hole; and
    performing a planarization process on the metal material to expose the mask pattern.

5. The method of claim 4, wherein the metal material includes copper.

6. The method of claim 1 the method further comprising, after forming the TSV:
    forming a metal interconnection coupled to the TSV, the metal interconnection being provided over the mask pattern; and
    forming a passivation layer over the metal interconnection.

7. The method of claim 1, wherein the removing of the first insulating layer includes performing a dip-out process.

8. The method of claim 1, wherein the first insulating layer is provided over a bottom surface of the contact hole.

* * * * *